(12) United States Patent
Yeh

(10) Patent No.: US 9,214,511 B2
(45) Date of Patent: Dec. 15, 2015

(54) INTEGRATED INDUCTOR AND INTEGRATED INDUCTOR FABRICATING METHOD

(71) Applicant: Realtek Semiconductor Corp., HsinChu (TW)

(72) Inventor: Ta-Hsun Yeh, Hsinchu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/203,506

(22) Filed: Mar. 10, 2014

(65) Prior Publication Data

US 2014/0284763 A1    Sep. 25, 2014

(30) Foreign Application Priority Data

Mar. 25, 2013    (TW) .............................. 102110484 A

(51) Int. Cl.
| | | |
|---|---|---|
| *H01L 49/02* | (2006.01) | |
| *H01L 23/522* | (2006.01) | |
| *H01L 23/64* | (2006.01) | |
| *H01L 25/065* | (2006.01) | |
| *H01L 23/48* | (2006.01) | |

(52) U.S. Cl.
CPC .............. *H01L 28/10* (2013.01); *H01L 23/481* (2013.01); *H01L 23/5225* (2013.01); *H01L 23/5227* (2013.01); *H01L 23/645* (2013.01); *H01L 25/0657* (2013.01); *H01L 2224/16225* (2013.01); *H01L 2224/16227* (2013.01); *H01L 2224/81* (2013.01); *H01L 2225/06527* (2013.01); *H01L 2225/06537* (2013.01); *H01L 2225/06572* (2013.01)

(58) Field of Classification Search
CPC .............. H01L 28/10; H01L 21/76898; H01L 23/5225; H01L 23/5227; H01L 23/645
See application file for complete search history.

(56) References Cited

U.S. PATENT DOCUMENTS

| | | | | |
|---|---|---|---|---|
| 2006/0170527 | A1* | 8/2006 | Braunisch | H01F 17/0006 336/223 |
| 2007/0090912 | A1* | 4/2007 | Lee | H01F 17/0013 336/200 |
| 2007/0281438 | A1* | 12/2007 | Liu et al. | 438/455 |
| 2008/0238599 | A1* | 10/2008 | Hebert | H01L 23/645 336/110 |
| 2008/0265367 | A1* | 10/2008 | Tan | H01L 24/81 257/531 |
| 2009/0090995 | A1* | 4/2009 | Yang et al. | 257/531 |
| 2011/0235302 | A1* | 9/2011 | Hijioka et al. | 361/811 |

* cited by examiner

*Primary Examiner* — Khaja Ahmad
(74) *Attorney, Agent, or Firm* — Winston Hsu; Scott Margo

(57) ABSTRACT

The present invention provides an integrated inductor and an integrated inductor fabricating method. The integrated inductor comprises: a semiconductor substrate, an inductor, and a redistribution layer (RDL). The inductor is formed above the semiconductor substrate. The RDL is formed above the inductor and has a specific pattern to form a patterned ground shield (PGS). The integrated inductor fabricating method comprises: forming a semiconductor substrate; forming an inductor above the semiconductor substrate; and forming redistribution layer (RDL) having a specific pattern above the inductor to form a patterned ground shield (PGS).

9 Claims, 18 Drawing Sheets

US 9,214,511 B2

INTEGRATED INDUCTOR AND INTEGRATED INDUCTOR FABRICATING METHOD

BACKGROUND OF THE INVENTION

1. Field of the Invention

The present invention relates to an integrated inductor and an integrated inductor fabricating method, and more particularly, to an integrated inductor with innovative patterned ground shield (PGS) and an integrated inductor fabricating method.

2. Description of the Prior Art

With development of SoC in IC manufacturing, passive components such as the integrated inductor has been widely integrated in high frequency IC. However, since the IC manufacturing generally uses silicon substrate structure, the integrated inductor has low Q-factor problem due to substrate loss.

Thus, a patterned ground shield (PGS) formed by polysilicon is utilized for reducing eddy current of the integrated inductor to increase Q-factor. For example, Please refer to FIG. 1. FIG. 1 shows a cross-sectional diagram of an integrated inductor 50 disclosed by U.S. Pat. No. 8,106,479. As shown in FIG. 1, a PGS 22 is formed between the inductor 30 and gate oxide layer 24. However, the PGS 22 has bad blocking effect for deep eddy current in the semiconductor substrate 10. In addition, material of the PGS 22 is polysilicon which can not reduce eddy current efficiently.

SUMMARY OF THE INVENTION

It is therefore one of the objectives of the present invention to provide an integrated inductor and an integrated inductor fabricating method with innovative patterned ground shield (PGS), to reduce eddy current and increase Q-factor.

In accordance with an embodiment of the present invention, an integrated inductor is disclosed. The integrated inductor comprises: a semiconductor substrate, an inductor, and a redistribution layer (RDL). The inductor is formed above the semiconductor substrate. The RDL is formed above the inductor and has a specific pattern to form a patterned ground shield (PGS). In accordance with an embodiment of the present invention, an integrated inductor fabricating method is disclosed. The integrated inductor fabricating method comprises: forming a semiconductor substrate; forming an inductor above the semiconductor substrate; and forming redistribution layer (RDL) having a specific pattern above the inductor to form a patterned ground shield (PGS).

Briefly summarized, compared with prior art, since the integrated inductor and the integrated inductor fabricating method disclosed by the present invention have the innovative PGS, forming of deep eddy current in the semiconductor substrate can be avoided and possible occurring paths of eddy current are blocked to attain the optimal blocking effect, and Q-factor can be increased.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
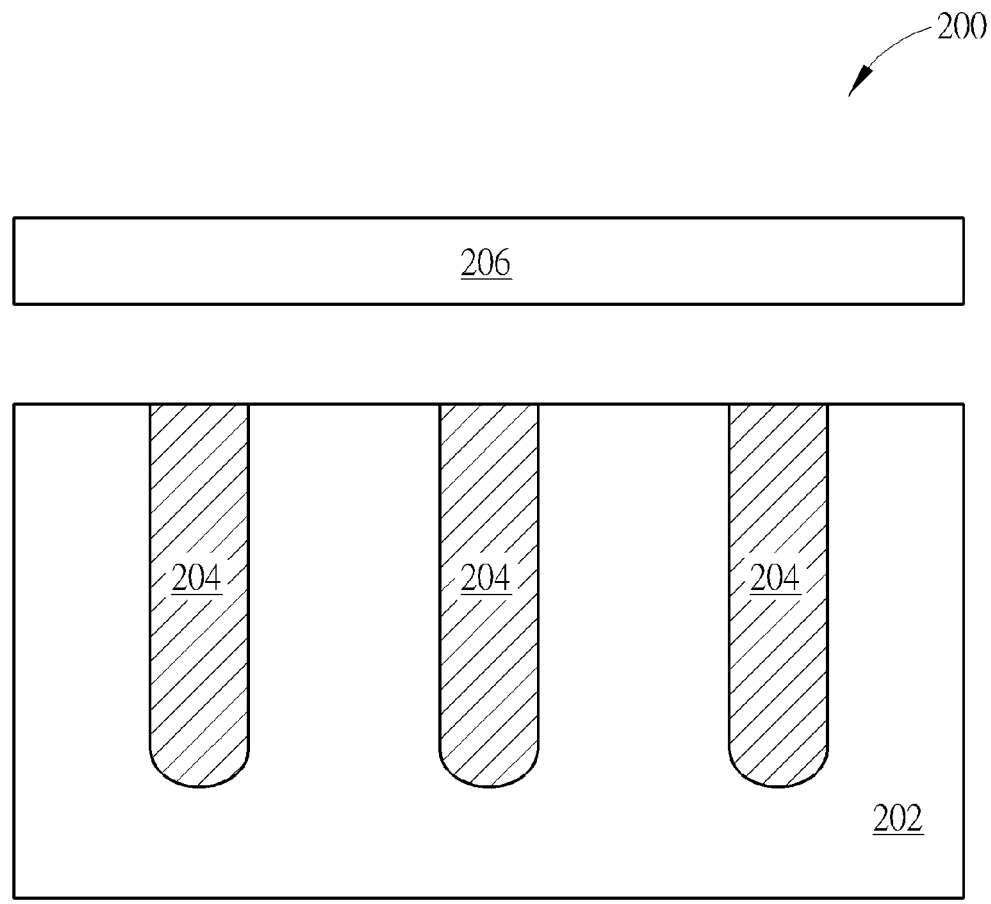
FIG. 2 shows a cross-sectional diagram of an integrated inductor in accordance with a first embodiment of the present invention.
Figure 3:
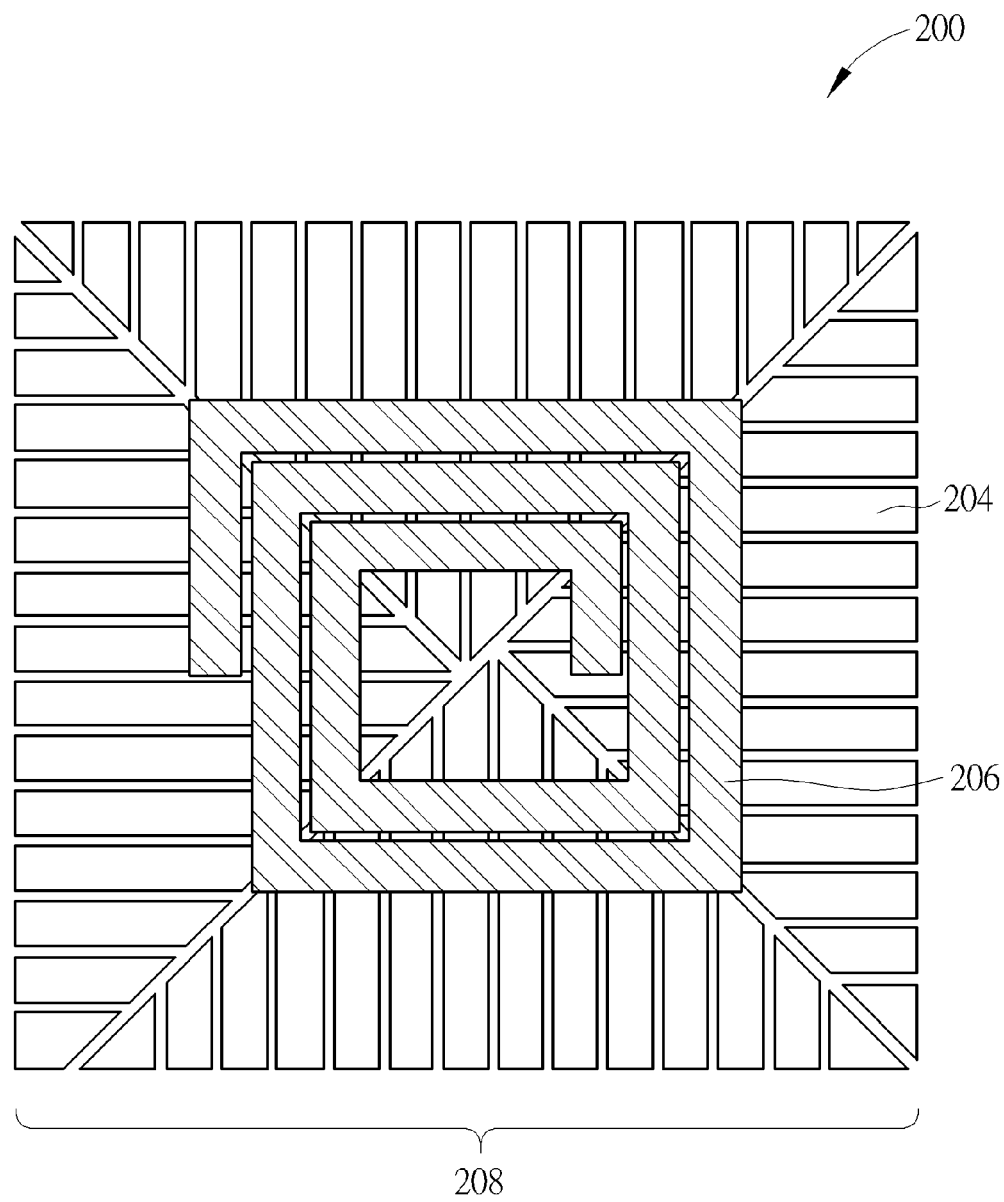
FIG. 3 shows a top-view structure diagram of the integrated inductor in the first embodiment of the present invention.

Please refer to FIG. 2. FIG. 2 shows a cross-sectional diagram of an integrated inductor 200 in accordance with a first embodiment of the present invention. As shown in FIG. 2, the integrated inductor 200 comprises: a semiconductor substrate 202, a plurality of deep trenches 204, and an inductor 206. The deep trenches 204 are formed in the semiconductor substrate 202 and arranged in a specific pattern (for example, as shown in FIG. 3, FIG. 3 shows a top-view structure diagram of the integrated inductor 200, but it is not meant to be a limitation of the present invention), and the deep trenches 204 are filled with a metal material (such as copper, aluminum, or gold) to form a patterned ground shield (PGS) 208, wherein width of the deep trenches 204 can be smaller than 20 micrometers, and depth of the deep trenches 204 can be smaller than 100 micrometers but greater than 20 micrometers. The inductor 206 can be formed above the semiconductor substrate 202. In addition, there can be no other redundant PGS between the inductor 206 and the semiconductor substrate 202. Please note that the above embodiment is only for an illustrative purpose and is not meant to be a limitation of the present invention. For example, the PGS 208 can be grounded in addition to further reduce eddy current and increase Q-factor. Please refer to FIG. 2 and FIG. 3, the PGS 208 is orthogonal to the inductor 206 below the inductor 206.

Figure 1:
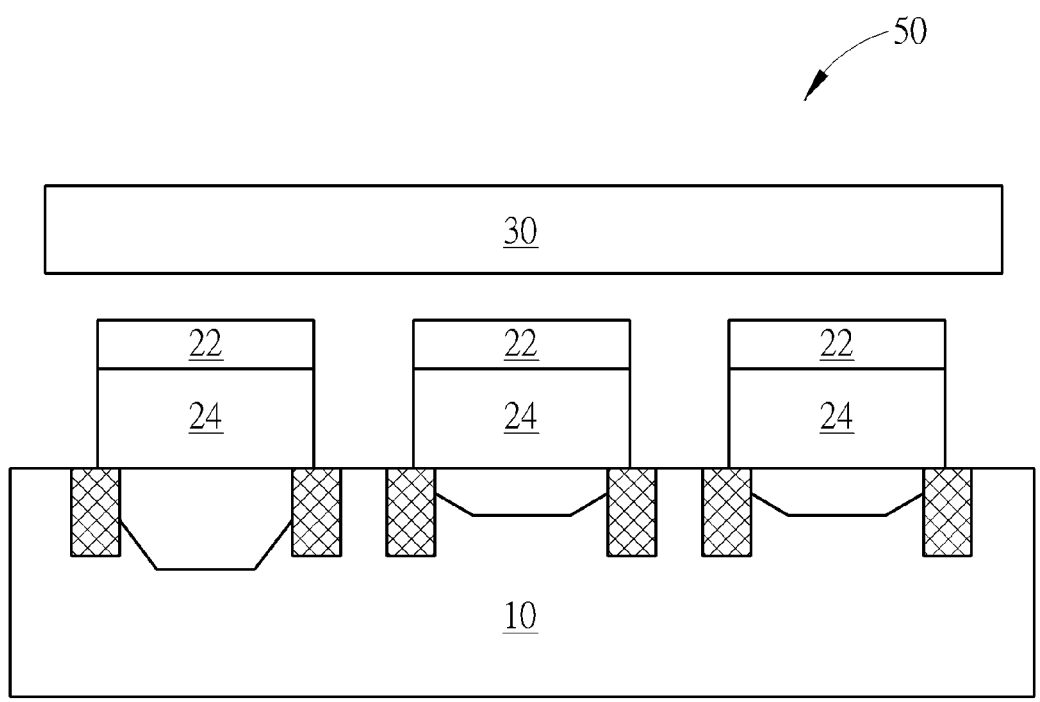
FIG. 1 shows a cross-sectional diagram of an integrated inductor disclosed by U.S. Pat. No. 8,106,479.

Different from past, current advanced semiconductor process technology can fabricate deep trenches with extremely small width, and thus the present invention can use it to fabricate the deep trenches 204 with the specific pattern in the semiconductor substrate 202, and fill the deep trenches 204 with a metal material to form an innovative PGS, so as to replace the PGS of forming polysilicon between the inductor and gate oxide layer in prior art (Please refer to FIG. 1)

Figure 4:
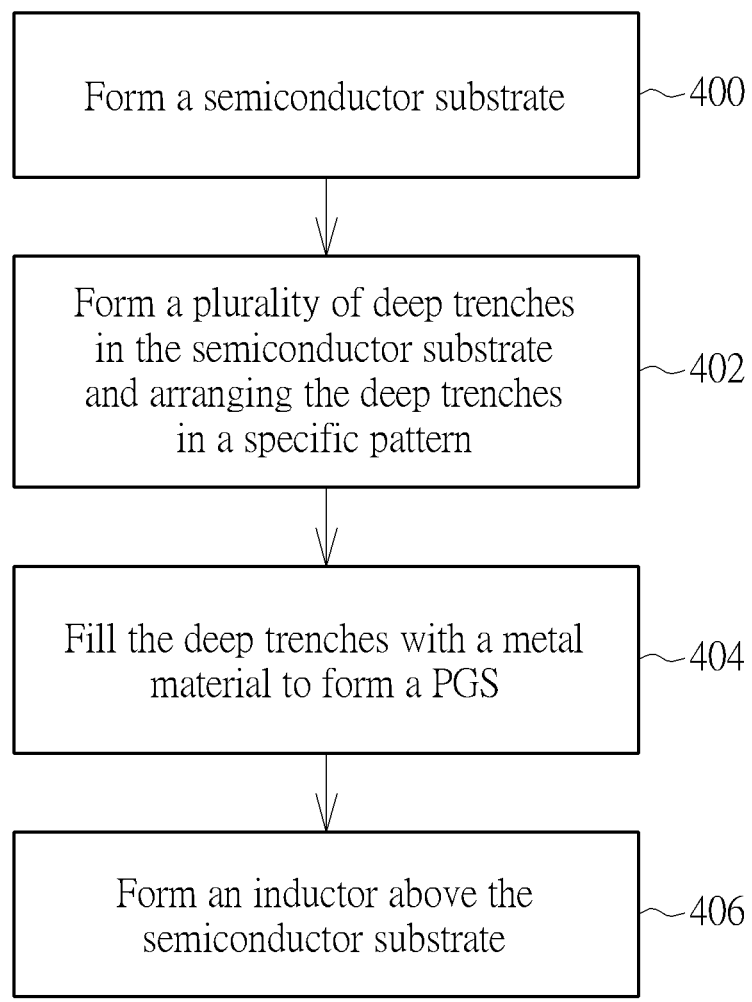
FIG. 4 shows a flowchart of the present invention showing an integrated inductor fabricating method according to the integrated inductor in the first embodiment of the present invention in accordance with a first embodiment of the present invention.

Please refer to FIG. 4. FIG. 4 shows a flowchart of the present invention showing an integrated inductor fabricating method according to the integrated inductor 200 in accordance with a first embodiment of the present invention. Provided that substantially the same result is achieved, the steps of the process flowchart do not have to be in the exact order shown in FIG. 4 and need not be contiguous, meaning that other steps can be intermediate. The integrated inductor fabricating method of the first embodiment of the present invention comprises the following steps:

Step 400: Form a semiconductor substrate;

Step 402: Form a plurality of deep trenches in the semiconductor substrate and arranging the deep trenches in a specific pattern.

Step 404: Fill the deep trenches with a metal material to form a PGS.

Step 406: Form an inductor above the semiconductor substrate.

Please note that the above embodiment is only for an illustrative purpose and is not meant to be a limitation of the present invention. For example, the integrated inductor fabricating method can further comprise a step: connecting the PGS to ground. Preferably, the PGS 208 is orthogonal to the inductor below the inductor.

Figure 5:
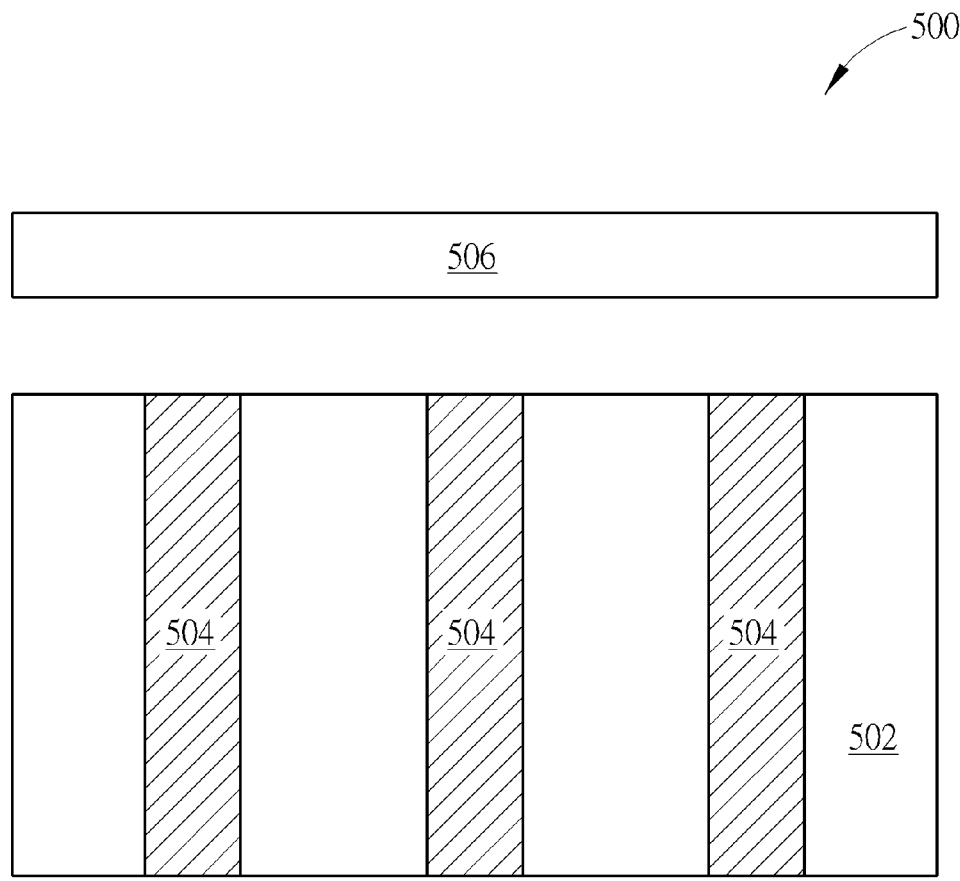
FIG. 5 shows a cross-sectional diagram of an integrated inductor in accordance with a second embodiment of the present invention.
Figure 6:
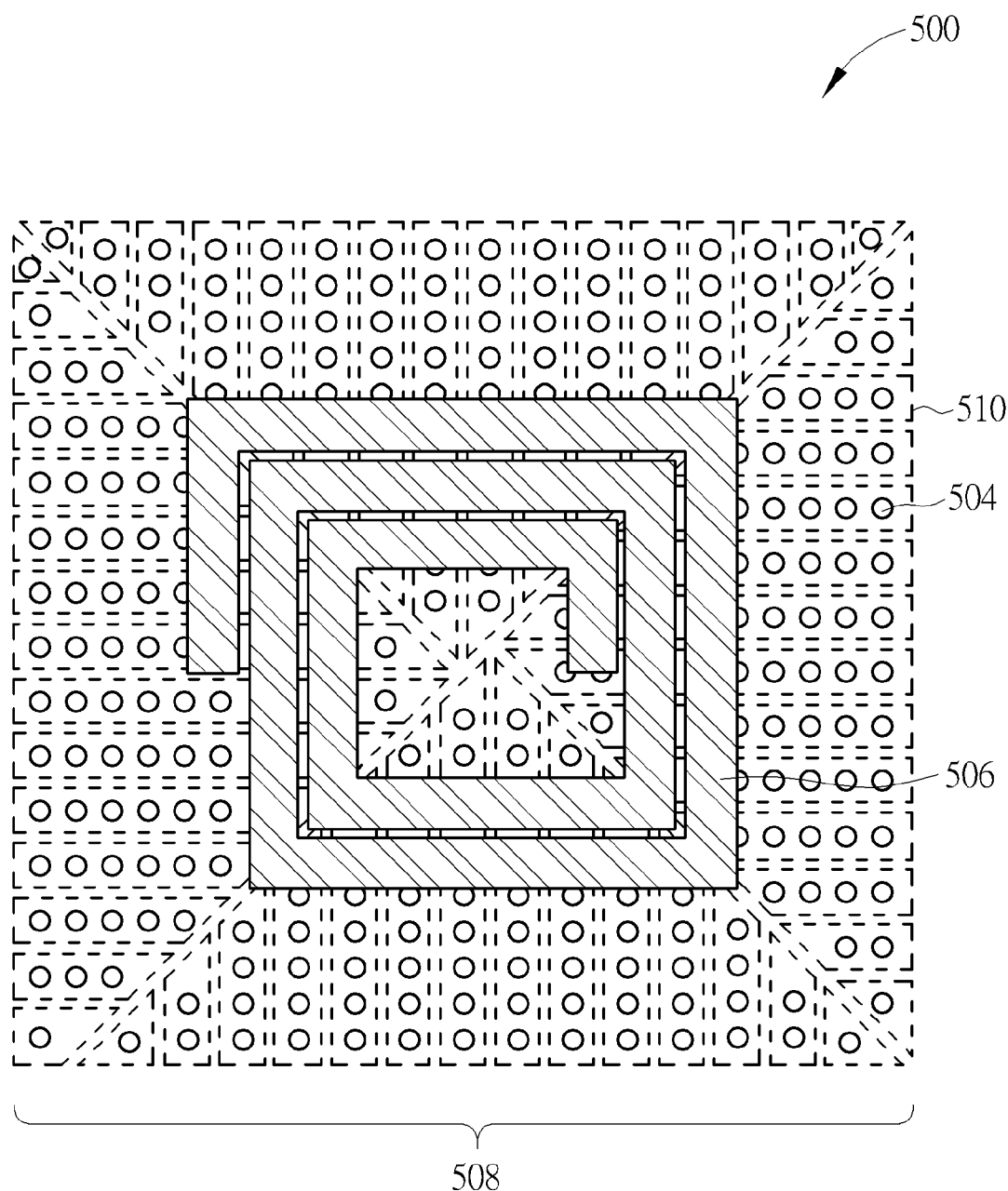
FIG. 6 shows a top-view structure diagram of the integrated inductor in the second embodiment of the present invention.
Figure 7:
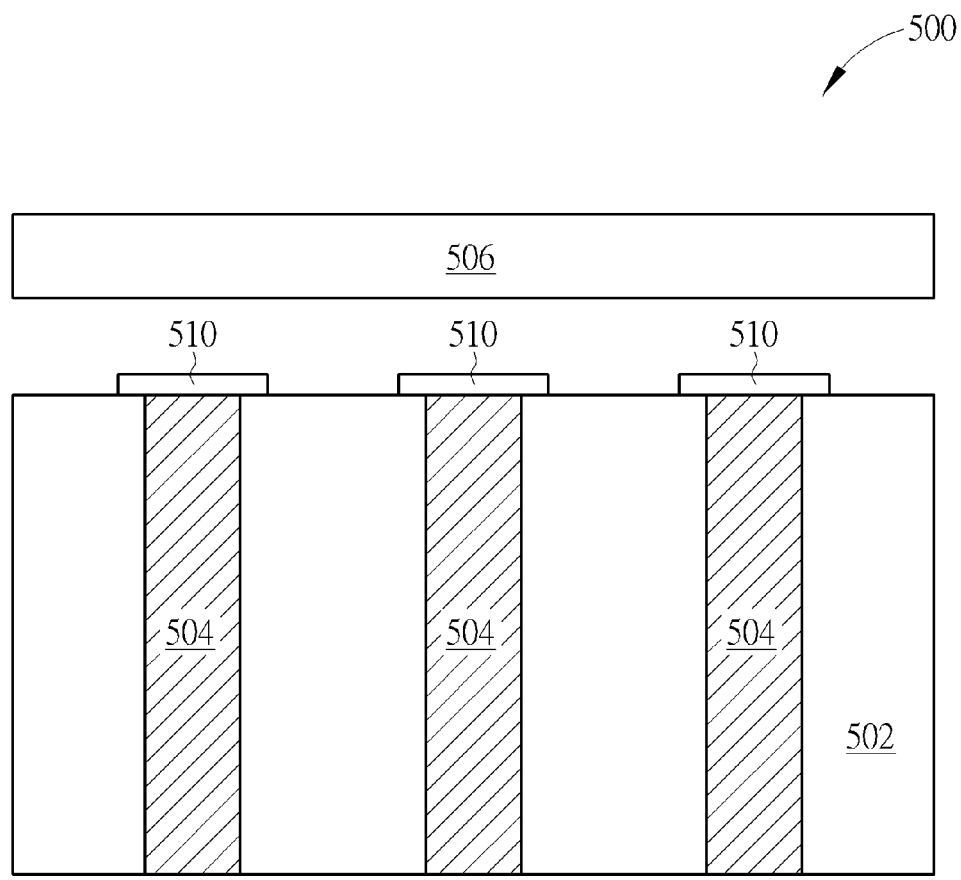
FIG. 7 shows a top-view structure diagram of the integrated inductor in the third embodiment of the present invention.
Figure 8:
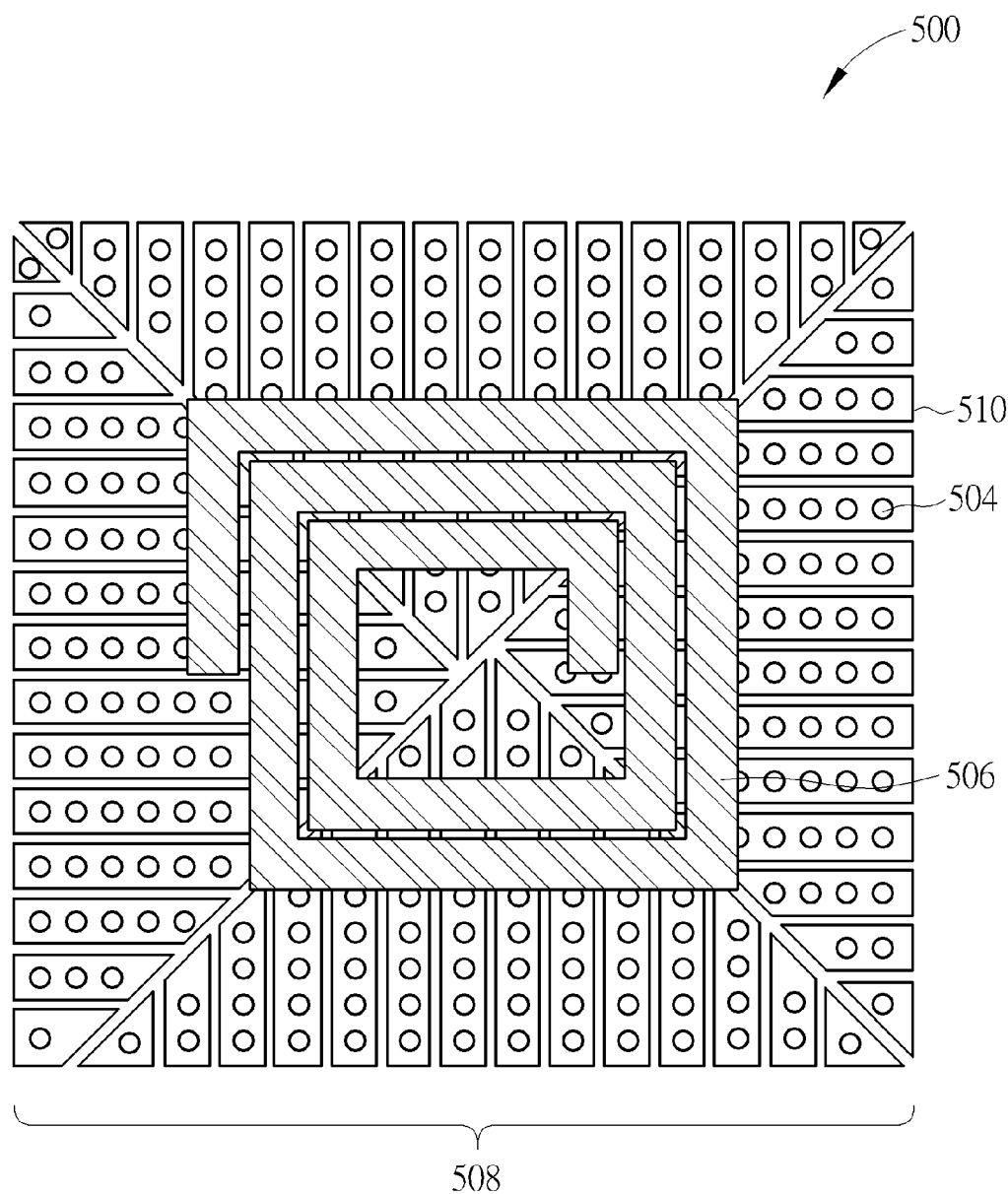
FIG. 8 shows a top-view structure diagram of the integrated inductor in the second embodiment of the present invention.

Please refer to FIG. 5. FIG. 5 shows a cross-sectional diagram of an integrated inductor 500 in accordance with a second embodiment of the present invention. As shown in FIG. 5, the integrated inductor 500 comprises: a semiconductor substrate 502, a plurality of through silicon vias (TSVs) 504, and an inductor 506. The TSVs 504 are formed in the semiconductor substrate 502 and arranged in a specific pattern (for example, as shown in FIG. 6, FIG. 6 shows a top-view structure diagram of the integrated inductor 500, but it is not meant to be a limitation of the present invention), and the TSVs 504 are filled with a metal material (such as copper, aluminum, or gold) to form a patterned ground shield (PGS) 508, wherein width of the TSVs 504 can be smaller than 20 micrometers. The inductor 506 can be formed above the semiconductor substrate 502. Please note that there can be no other redundant PGS between the inductor 506 and the semiconductor substrate 502 in the present invention. In addition, the integrated inductor 500 can be applied to a Si Interposer in a 3D IC. Please note that the above embodiment is only for an illustrative purpose and is not meant to be a limitation of the present invention. For example, the PGS 508 can be grounded in addition to further reduce eddy current and increase Q-factor. Moreover, in a third embodiment of the present invention, the integrated inductor 500 can further comprises: a shielding metal layer 510, for connecting with the TSVs 504 according to the specific pattern, as shown in FIG. 7. The shielding metal layer 510 also can be connected with the TSVs 504 according to the specific pattern to jointly form the PGS 508, as shown in FIG. 8. Preferably, the shielding metal layer 510 of the PGS 508 is orthogonal to the inductor below the inductor, wherein the shielding metal layer 510 can be formed by metal 1 in the semiconductor process.

Different from past, current advanced semiconductor process technology can fabricate TSVs with extremely small width, and thus the present invention can use it to fabricate the TSVs 504 with the specific pattern in the semiconductor substrate 502, and fill the TSVs 504 with a metal material to form an innovative PGS, so as to replace the PGS of forming polysilicon between the inductor and gate oxide layer in prior art (Please refer to FIG. 1)

Figure 9:
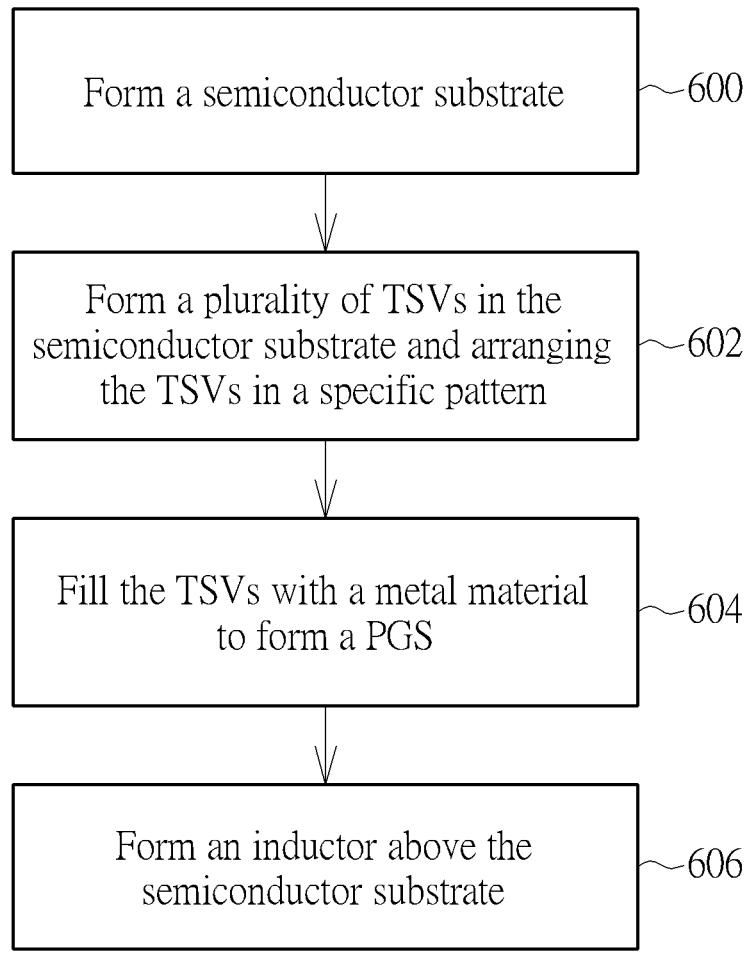
FIG. 9 shows a flowchart of the present invention showing an integrated inductor fabricating method according to the integrated inductor in the second embodiment of the present invention in accordance with a second embodiment of the present invention.

Please refer to FIG. 9. FIG. 9 shows a flowchart of the present invention showing an integrated inductor fabricating method according to the integrated inductor 500 in accordance with a second embodiment of the present invention. Provided that substantially the same result is achieved, the steps of the process flowchart do not have to be in the exact order shown in FIG. 9 and need not be contiguous, meaning that other steps can be intermediate. The integrated inductor fabricating method of the second embodiment of the present invention comprises the following steps:

Step 600: Form a semiconductor substrate;

Step 602: Form a plurality of TSVs in the semiconductor substrate and arranging the TSVs in a specific pattern.

Step 604: Fill the TSVs with a metal material to form a PGS.

Step 606: Form an inductor above the semiconductor substrate.

Please note that the above embodiment is only for an illustrative purpose and is not meant to be a limitation of the present invention. For example, the integrated inductor fabricating method can further comprise a step: connecting a shielding metal layer with the TSVs according to the specific pattern. Preferably, the shielding metal layer of the PGS is orthogonal to the inductor below the inductor, wherein the shielding metal layer can be formed by metal 1 in the semiconductor process.

Figure 10:
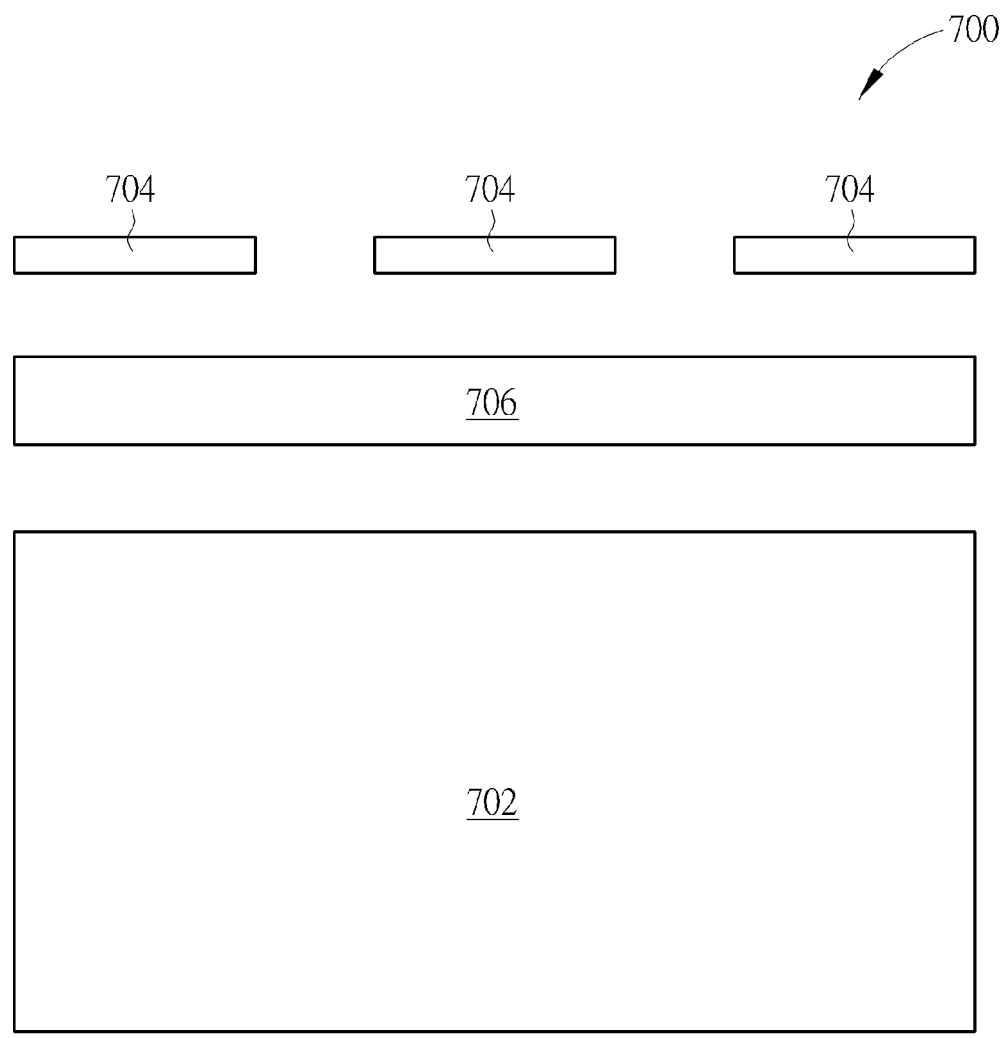
FIG. 10 shows a cross-sectional diagram of an integrated inductor in accordance with a fourth embodiment of the present invention.
Figure 11:
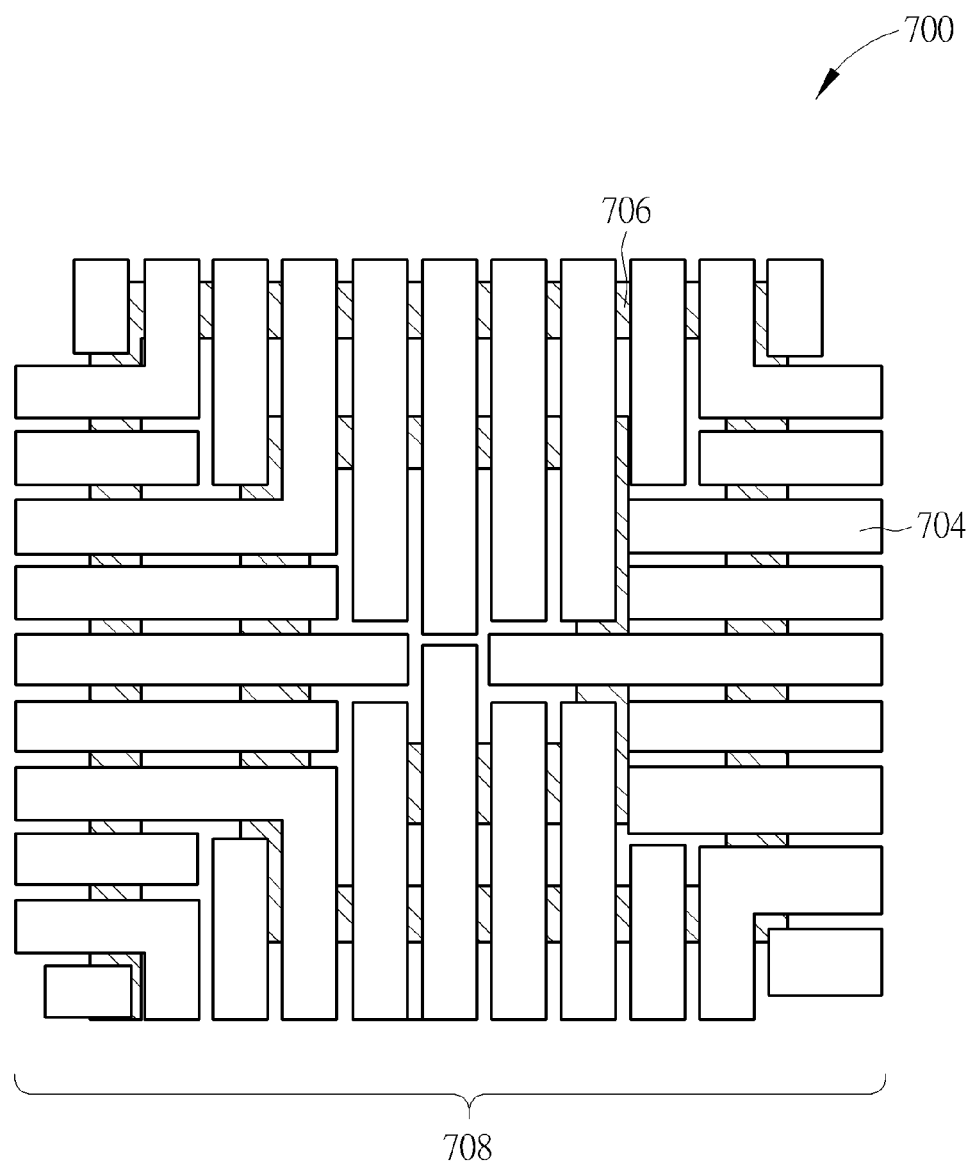
FIG. 11 shows a top-view structure diagram of the integrated inductor in the fourth embodiment of the present invention.
Figure 12:
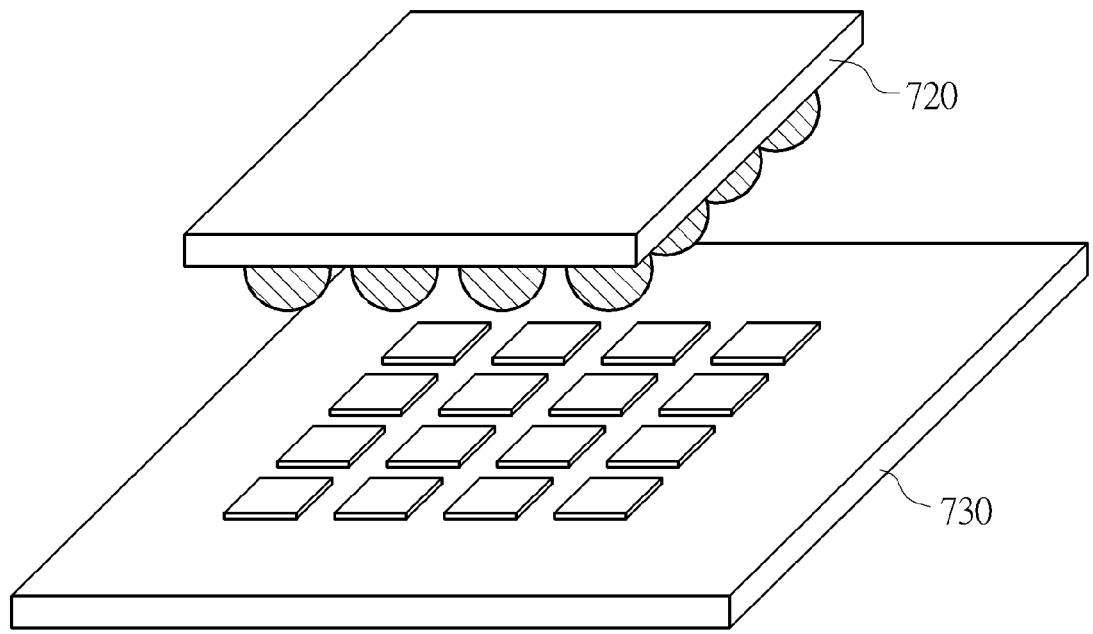
FIG. 12 shows a simplified diagram of the integrated inductor of the fourth embodiment applied to the Flip Chip.
Figure 12:
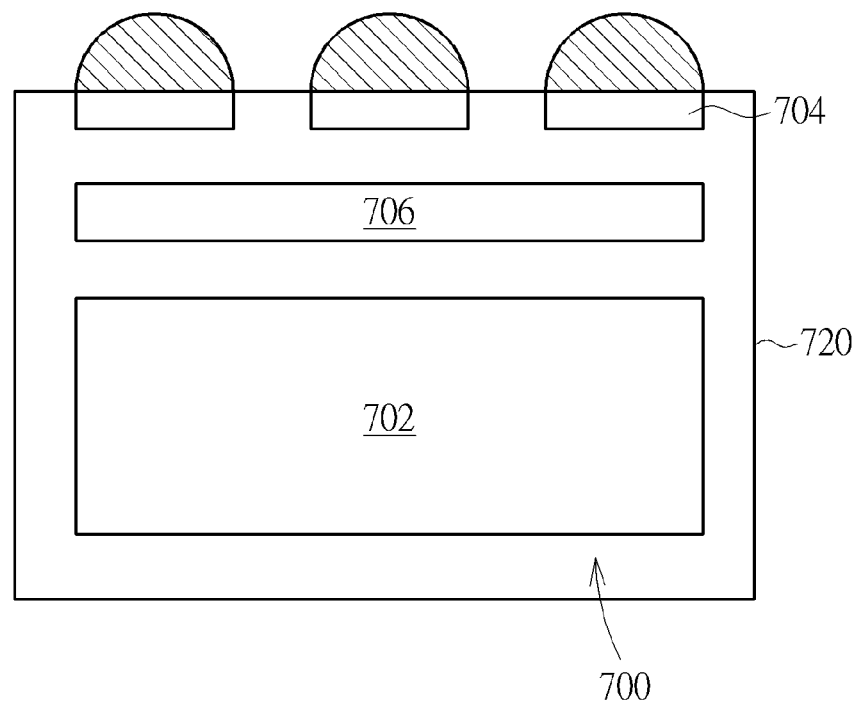

Please refer to FIG. 10. FIG. 10 shows a cross-sectional diagram of an integrated inductor 700 in accordance with a fourth embodiment of the present invention. As shown in FIG. 10, the integrated inductor 700 comprises: a semiconductor substrate 702, a redistribution layer (RDL) metal layer 704, and an inductor 706. The inductor 706 is formed above the semiconductor substrate 702. The RDL metal layer 704 is formed above the inductor 706 with a specific pattern (for example, as shown in FIG. 11, FIG. 11 shows a top-view structure diagram of the integrated inductor 700, but it is not meant to be a limitation of the present invention) to form a patterned ground shield (PGS) 708, wherein material of the RDL metal layer 704 can be aluminum. Please note that there can be no other redundant PGS between the inductor 706 and the semiconductor substrate 702 in the present invention. In addition, the integrated inductor 700 can be applied to an integrated passive device (IPD) in a 3D IC. The integrated inductor 700 in this embodiment can be applied to Flip Chip. Please refer to FIG. 12. FIG. 12 shows a simplified diagram of the integrated inductor 700 of the fourth embodiment applied to the Flip Chip. As shown in FIG. 12, when a first chip 720 comprising the integrated inductor 700 is reversed down, the PGS 708 formed by the RDL metal layer 704 above the integrated inductor 700 can reduce eddy current and increase Q-factor, and can further prevent inductor magnetic field flow in the first chip 720 from affecting signals in a second chip 730 below efficiently. Please note that the above embodiment is only for an illustrative purpose and is not meant to be a limitation of the present invention. For example, the PGS 708 can be grounded in addition to further reduce eddy current and increase Q-factor. As shown in FIG. 10 and FIG. 11, preferably, the RDL metal layer 704 is orthogonal to the inductor 706 above the inductor 706.

Figure 13:
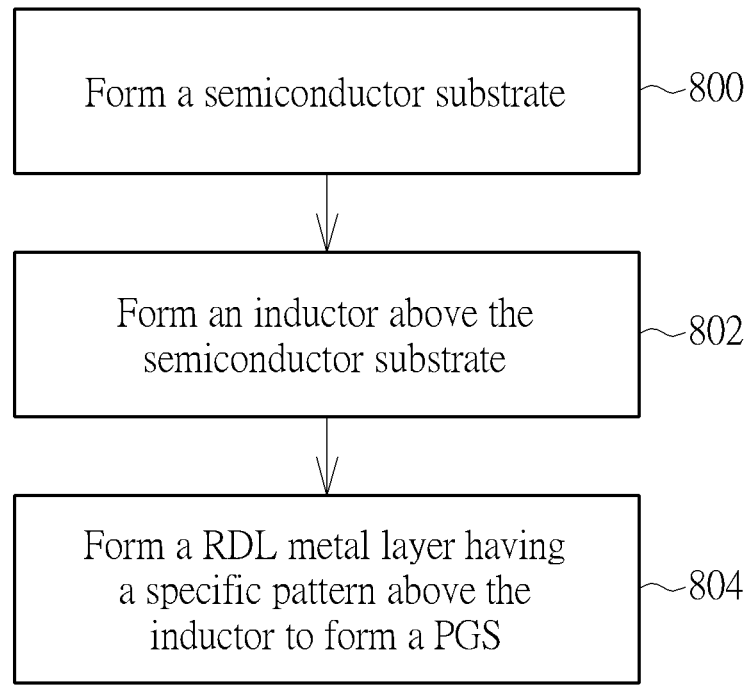
FIG. 13 shows a flowchart of the present invention showing an integrated inductor fabricating method according to the integrated inductor in the fourth embodiment of the present invention in accordance with a fourth embodiment of the present invention.

Please refer to FIG. 13. FIG. 13 shows a flowchart of the present invention showing an integrated inductor fabricating method according to the integrated inductor 700 in accordance with a fourth embodiment of the present invention. Provided that substantially the same result is achieved, the steps of the process flowchart do not have to be in the exact order shown in FIG. 13 and need not be contiguous, meaning that other steps can be intermediate. The integrated inductor fabricating method of the fourth embodiment of the present invention comprises the following steps:

Step 800: Form a semiconductor substrate;

Step 802: Form an inductor above the semiconductor substrate.

Step 804: Form a RDL metal layer having a specific pattern above the inductor to form a PGS.

Please note that the above embodiment is only for an illustrative purpose and is not meant to be a limitation of the present invention. For example, the integrated inductor fabricating method can further comprise a step: connecting the PGS to ground. Preferably, the RDL metal layer is orthogonal to the inductor above the inductor.

Figure 14:
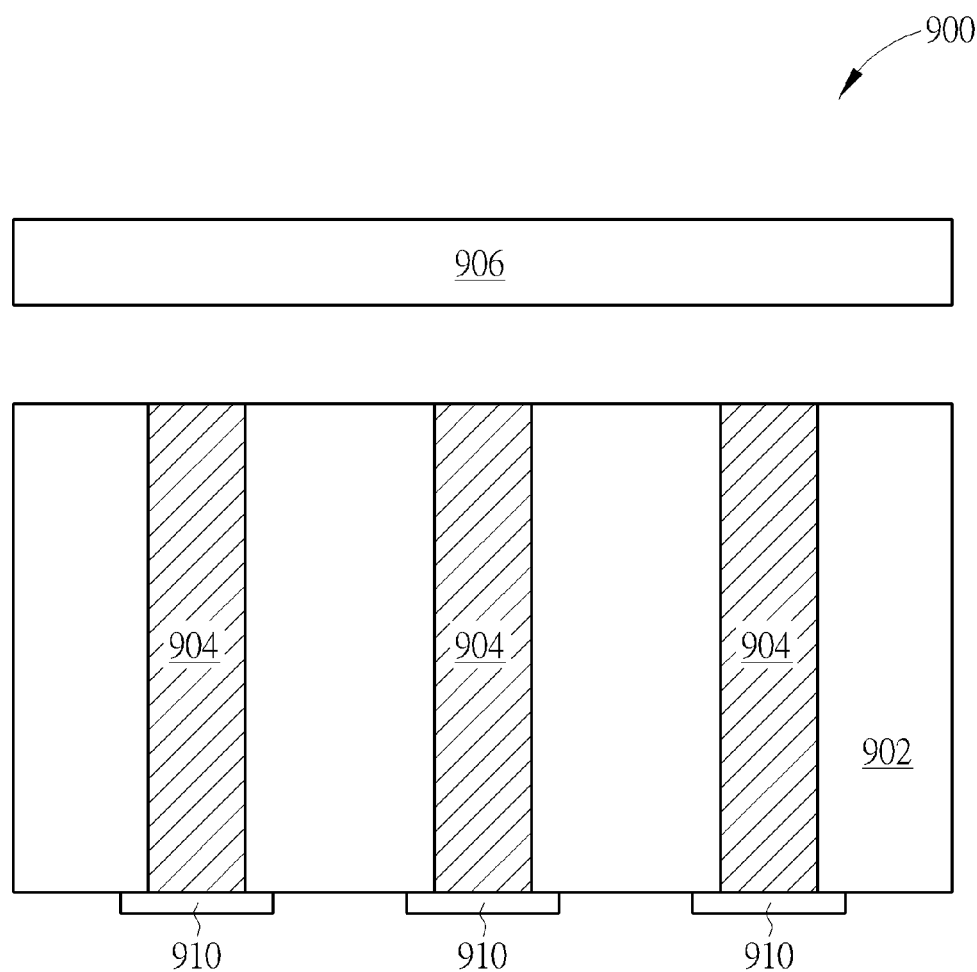
FIG. 14 shows a cross-sectional diagram of an integrated inductor in accordance with a fifth embodiment of the present invention.
Figure 15:
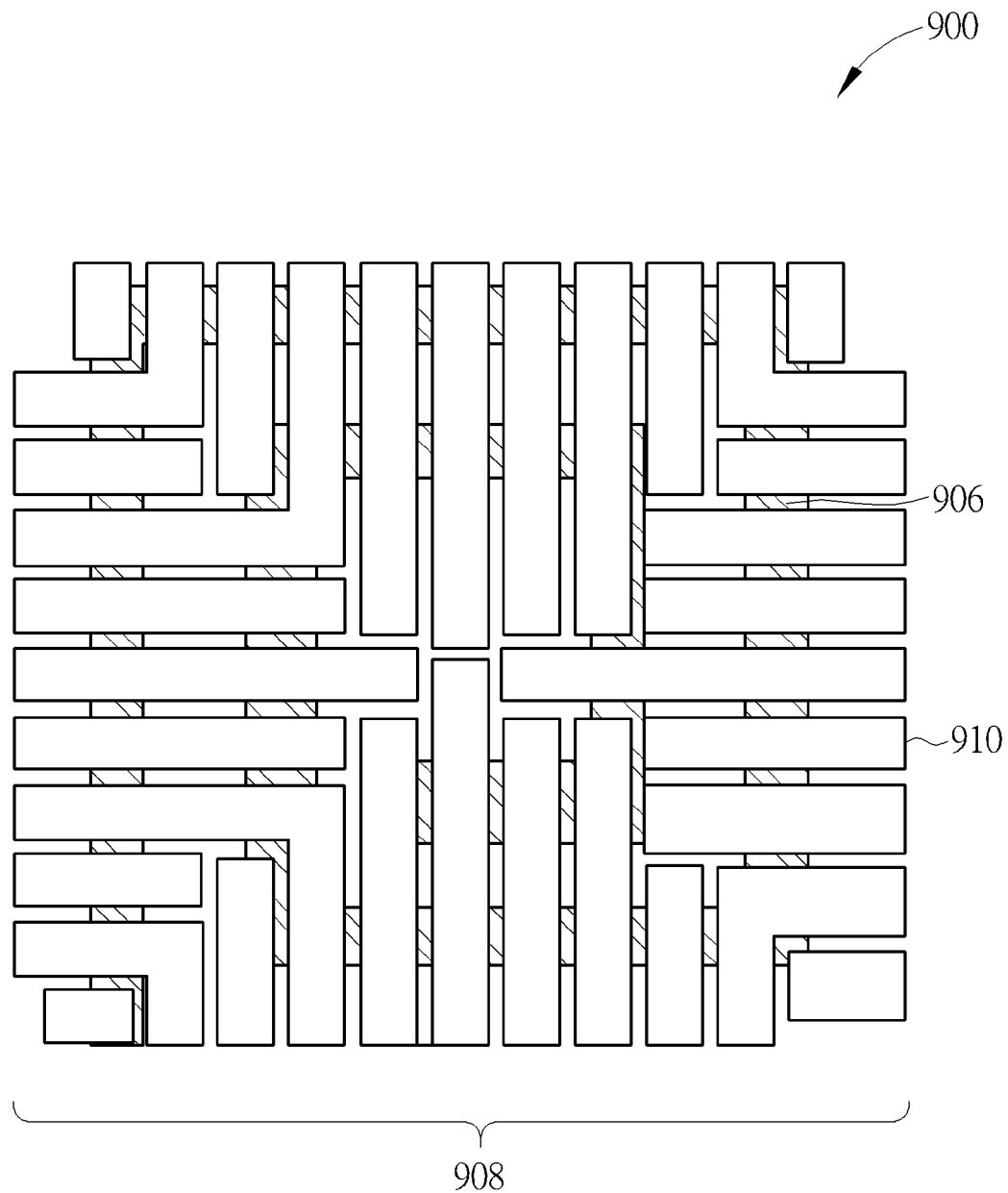
FIG. 15 shows a bottom-view structure diagram of the integrated inductor in the fifth embodiment of the present invention.
Figure 16:
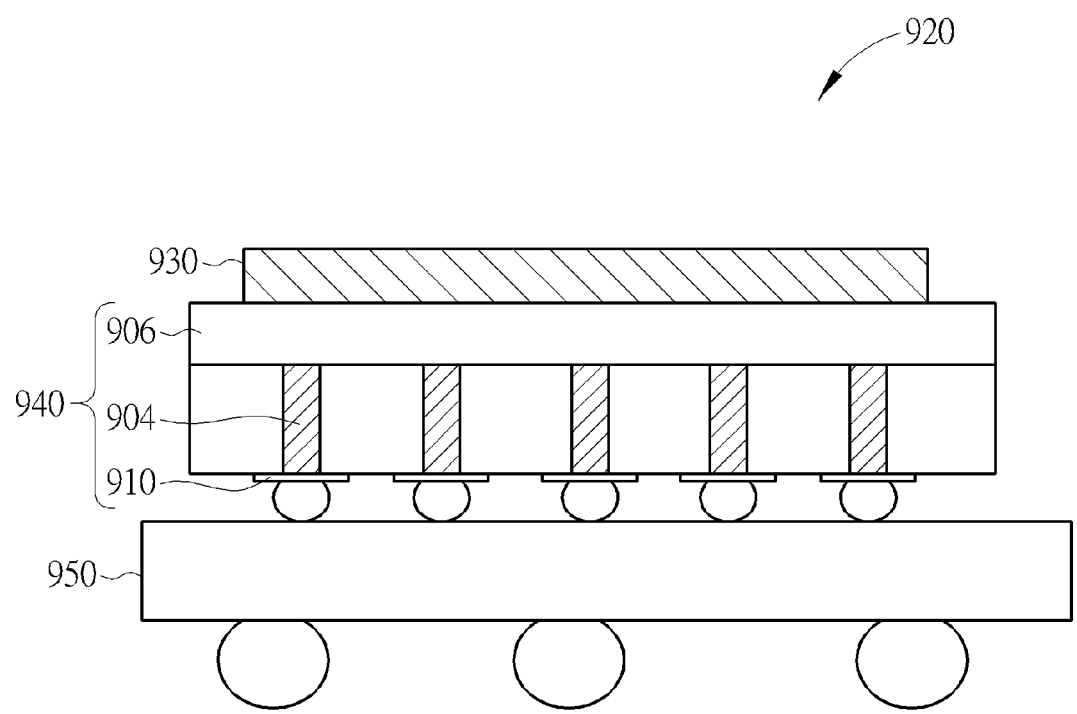
FIG. 16 shows a simplified diagram of the integrated inductor of the fifth embodiment applied to a 3D IC.

Please refer to FIG. 14. FIG. 14 shows a cross-sectional diagram of an integrated inductor 900 in accordance with a fifth embodiment of the present invention. As shown in FIG. 14, the integrated inductor 900 comprises: a semiconductor substrate 902, a plurality of through silicon vias (TSVs) 904, an inductor 906, and a back side redistribution layer (RDL) metal layer 910. The inductor 906 formed above the semiconductor substrate 902. The back side RDL metal layer 910 is formed below the semiconductor substrate 902 and connected with the TSVs, and the back side RDL metal layer 910 has a specific pattern (for example, as shown in FIG. 15, FIG. 15 shows a bottom-view structure diagram of the integrated inductor 900, but it is not meant to be a limitation of the present invention) to form a patterned ground shield (PGS) 908, wherein material of the back side RDL metal layer 910 can be aluminum. Please note that there can be no other redundant PGS between the inductor 906 and the semiconductor substrate 902 in the present invention. In addition, the integrated inductor 900 can be applied to a Si Interposer in a 3D IC. Please refer to FIG. 16. FIG. 16 shows a simplified diagram of the integrated inductor 900 of the fifth embodiment applied to a 3D IC 920. As shown in FIG. 16, 3D IC 920 comprises a first chip 930, a Si Interposer 940, and a second chip 950, wherein the Si Interposer 940 has the integrated inductor 900, and the PGS 908 formed by the back side RDL metal layer 910 below the integrated inductor 900 can reduce eddy current and increase Q-factor, and can further prevent inductor magnetic field flow in the Si Interposer 940 from affecting signals in the second chip 950 below efficiently. Please note that the above embodiment is only for an illustrative purpose and is not meant to be a limitation of the present invention. For example, the PGS 908 can be grounded in addition to further reduce eddy current and increase Q-factor.

Figure 17:
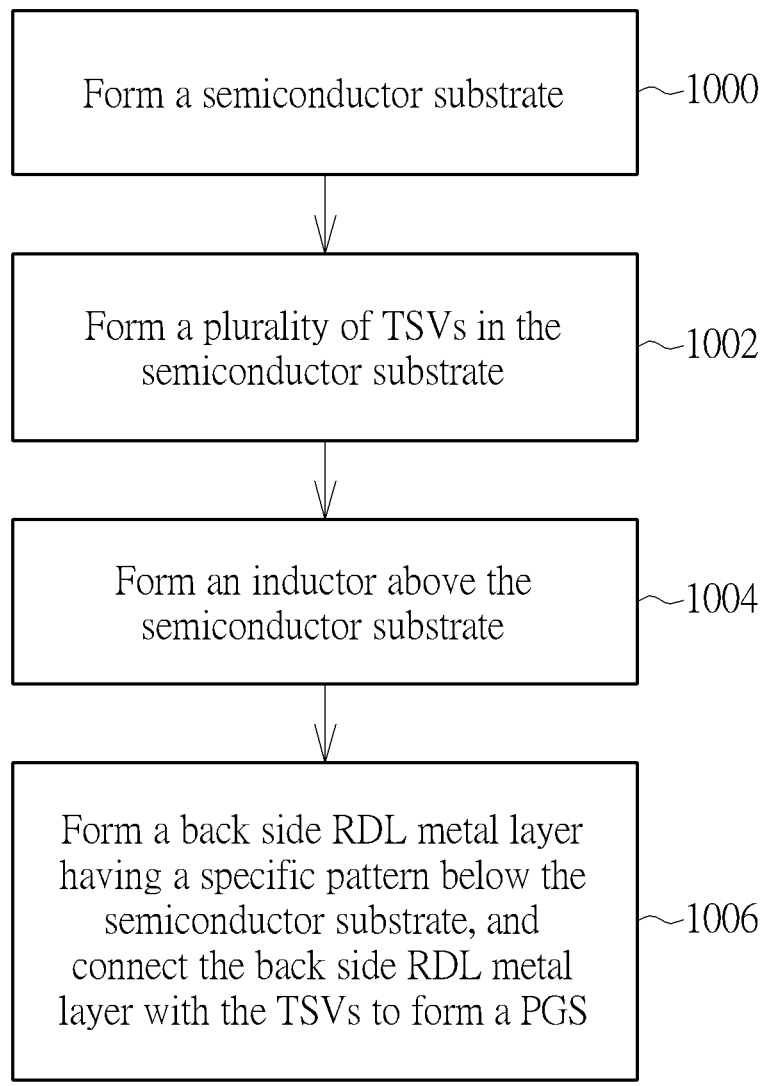
FIG. 17 shows a flowchart of the present invention showing an integrated inductor fabricating method according to the integrated inductor in the fifth embodiment of the present invention in accordance with a fifth embodiment of the present invention.

Please refer to FIG. 17. FIG. 17 shows a flowchart of the present invention showing an integrated inductor fabricating method according to the integrated inductor 900 in accordance with a fifth embodiment of the present invention. Provided that substantially the same result is achieved, the steps of the process flowchart do not have to be in the exact order shown in FIG. 17 and need not be contiguous, meaning that other steps can be intermediate. The integrated inductor fabricating method of the fifth embodiment of the present invention comprises the following steps:

Step 1000: Form a semiconductor substrate;

Step 1002: Form a plurality of TSVs in the semiconductor substrate.

Step 1004: Form an inductor above the semiconductor substrate.

Step 1006: Form a back side RDL metal layer having a specific pattern below the semiconductor substrate, and connect the back side RDL metal layer with the TSVs to form a PGS.

Please note that the above embodiment is only for an illustrative purpose and is not meant to be a limitation of the present invention. For example, the integrated inductor fabricating method can further comprise a step: connecting the PGS to ground.

Figure 18:
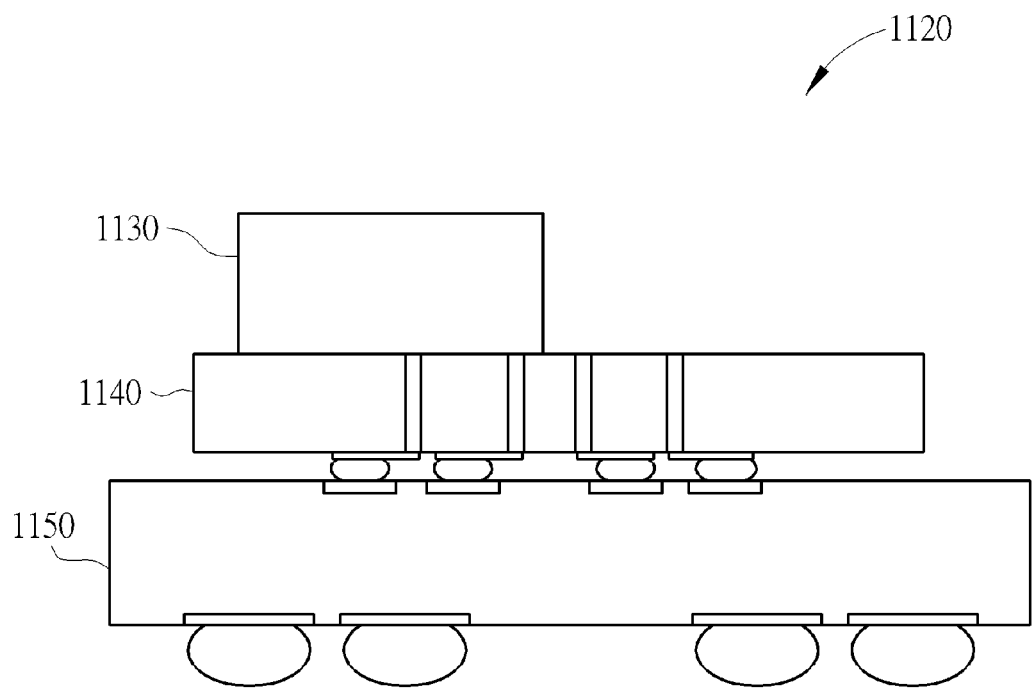
FIG. 18 shows a simplified diagram of the integrated inductor of the present invention applied to a 3D IC.

In addition, the integrated inductor of the present invention can be applied to a Si Interposer in a 3D IC. Please refer to FIG. 18. FIG. 18 shows a simplified diagram of the integrated inductor of the present invention applied to a 3D IC 1120. As shown in FIG. 18, 3D IC 1120 comprises a first chip 1130, a Si Interposer 1140, and a second chip 1150, wherein the Si Interposer 1140 has the integrated inductor of the present invention, which comprises: through silicon vias (TSVs) and a back side redistribution layer (RDL) metal layer or a RDL metal layer.

Briefly summarized, compared with prior art, since the integrated inductor and the integrated inductor fabricating method disclosed by the present invention have the innovative PGS, forming of deep eddy current in the semiconductor substrate can be avoided and possible occurring paths of eddy current are blocked to attain the optimal blocking effect, and Q-factor can be increased, and the integrated inductor and the integrated inductor fabricating method disclosed by the present invention can be applied to a 3D IC or Flip Chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated inductor, comprising:
a semiconductor substrate;
an inductor, formed above the semiconductor substrate; and
only one redistribution layer (RDL) of metal, formed above the inductor with a specific pattern to form a patterned ground shield (PGS) that is grounded, wherein the RDL of metal comprises a plurality of metal strips, and wherein the semiconductor substrate, the inductor, and the plurality of metal strips are within a semiconductor chip, and each of the metal strips has an exposed surface from the semiconductor chip.

2. The integrated inductor of claim 1, wherein material of the RDL of metal is aluminum.

3. The integrated inductor of claim 1, applied to an integrated passive device (IPD) in a 3D IC.

4. The integrated inductor of claim 1, wherein there is no PGS between the inductor and the semiconductor substrate.

5. The integrated inductor of claim 1, applied to Flip Chip.

6. The integrated inductor of claim 1, wherein the RDL of metal is substantially orthogonal to the inductor above the inductor.

7. An integrated inductor fabricating method, comprising:
   forming a semiconductor substrate;
   forming an inductor above the semiconductor substrate; and
   forming only one redistribution layer (RDL) of metal above the inductor with a specific pattern to form a patterned ground shield (PGS) that is grounded, wherein the RDL of metal comprises a plurality of metal strips, and wherein the semiconductor substrate, the inductor, and the plurality of metal strips are within a semiconductor chip, and each of the metal strips has an exposed surface from the semiconductor chip.

8. The integrated inductor fabricating method of claim 7, wherein material of the RDL of metal is aluminum.

9. The integrated inductor fabricating method of claim 7, wherein the RDL of metal is substantially orthogonal to the inductor above the inductor.

* * * * *